United States Patent
Tyan et al.

(10) Patent No.: US 7,033,850 B2
(45) Date of Patent: Apr. 25, 2006

(54) ROLL-TO-SHEET MANUFACTURE OF OLED MATERIALS

(75) Inventors: Yuan-Sheng Tyan, Webster, NY (US); David R. Strip, Albuquerque, NM (US)

(73) Assignee: Eastman Kodak Company, Rochester, NY (US)

( * ) Notice: Subject to any disclaimer, the term of this patent is extended or adjusted under 35 U.S.C. 154(b) by 35 days.

(21) Appl. No.: 10/881,143

(22) Filed: Jun. 30, 2004

(65) Prior Publication Data

US 2006/0003474 A1  Jan. 5, 2006

(51) Int. Cl.
*H01L 21/00* (2006.01)
*H01L 51/40* (2006.01)

(52) U.S. Cl. .............................. 438/26; 438/38; 438/99
(58) Field of Classification Search .................. 438/26, 438/38, 99
See application file for complete search history.

(56) References Cited

U.S. PATENT DOCUMENTS

| | | | |
|---|---|---|---|
| 4,720,432 A * | 1/1988 | VanSlyke et al. ............ | 428/457 |
| 5,844,363 A | 12/1998 | Gu et al. | |
| 6,355,125 B1 | 3/2002 | Tahon et al. | |
| 6,664,137 B1 * | 12/2003 | Weaver ....................... | 438/125 |
| 6,737,753 B1 * | 5/2004 | Kumar et al. ................ | 257/787 |
| 6,867,539 B1 * | 3/2005 | McCormick et al. ........ | 313/504 |
| 2001/0055458 A1 | 12/2001 | Ladd | |

FOREIGN PATENT DOCUMENTS

EP  1038663  9/2000

* cited by examiner

*Primary Examiner*—Trung Dang
(74) *Attorney, Agent, or Firm*—Raymond L. Owens

(57) ABSTRACT

A method for making organic light-emitting diodes on a flexible substrate includes supplying a flexible substrate, forming a plurality of thin-film layers on the flexible substrate to produce an organic light-emitting diode, disposing the flexible substrate above a barrier base and disposing a barrier cover over the substrate and the barrier base, and sealing the barrier base to the barrier cover to encapsulate the substrate between the barrier cover and the barrier base.

20 Claims, 5 Drawing Sheets

ROLL-TO-SHEET MANUFACTURE OF OLED MATERIALS

FIELD OF THE INVENTION

This invention pertains to the field of organic light-emitting devices (OLEDS) and more specifically to manufacture of OLEDs on flexible substrates.

BACKGROUND OF THE INVENTION

Flexible substrates offer a number of advantages in making OLEDs, particularly in their ability to be fed through web handling equipment. A considerable effort has been devoted to making flexible substrates including metals, plastics, and glasses. However, each of these materials has so far failed to deliver the right combination of price/performance to meet commercial needs. Plastics fail to provide an adequate barrier to moisture and oxygen infiltration, leading to premature failure of the OLED device produced on the substrate. Metals and glasses provide adequate barrier properties but have their own limitations. For metals, the obvious problem is that the metal is not transparent and therefore requires a transparent barrier layer for the other surface. In addition, since metals are conductive, an insulating layer should be deposited on the metal so that the OLED can be fabricated on top of the barrier layer. This increases complexity and cost. A number of glass companies have demonstrated glasses thin enough to be rolled on cores of a foot or less and are therefore flexible enough for web-handling, as long as all the material limitations are obeyed. However, this glass is expensive to produce and handle, especially because of the very large weight of a roll of glass. When broken, these glasses produce extremely sharp shards, often compared to razor blades.

In spite of the advantages of a flexible substrate for manufacture, a flexible substrate often has inadequate durability or rigidity for the final application.

SUMMARY OF THE INVENTION

It is therefore an object of the present invention to provide a web-compatible substrate on which the OLEDs are formed. The substrate is subsequently encapsulated between two barrier layers providing the required protection against oxygen and water vapor.

This object is achieved by a method for making organic light-emitting diodes on a flexible substrate comprising:
 a) supplying a flexible substrate;
 b) forming a plurality of thin-film layers on the flexible substrate to produce an organic light-emitting diode;
 c) disposing the flexible substrate above a barrier base and disposing a barrier cover over the substrate and the barrier base; and
 d) sealing the barrier base to the barrier cover to encapsulate the substrate between the barrier cover and the barrier base.

It is a feature of the present invention that it makes use of the benefits of web production without the drawbacks of flexible barrier substrates.

DETAILED DESCRIPTION OF THE INVENTION

Figure 1:
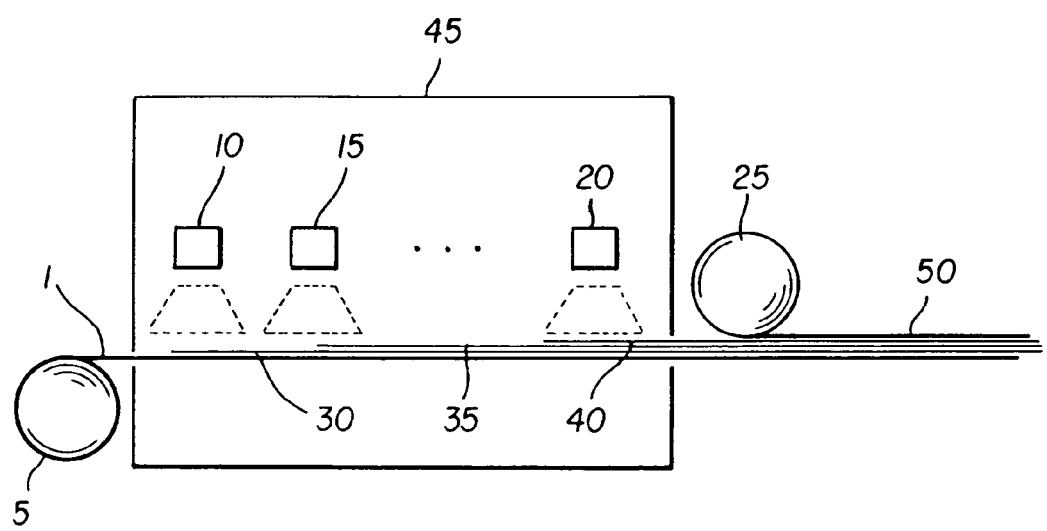
FIG. 1 is a schematic diagram of a prior art for producing OLEDs on a flexible substrate.

FIG. 1 illustrates a prior art structure for producing OLEDs on a web system using a flexible substrate. In this schematic, a flexible substrate 1 is provided on a substrate supply roll 5 which typically contains a considerable length of the substrate 1. As the substrate 1 unrolls and works its way through a coating machine 45, it passes a series of coating sources 10, 15, and 20 which deposit organic material layers 30, 35, and 40. The coating sources can be evaporative sources in the case of small molecule OLEDs, or they can be inkjet heads, curtain coaters, or gravure printers for polymeric OLEDs, or they can employ any suitable coating technology depending on the type of OLED.

After coating is complete, a barrier cover material is provided from a barrier cover supply roll 25. The barrier cover 50 is mated to the substrate/thin-film sandwich and the barrier cover 50 is bonded to the substrate. As already noted, FIG. 1 is highly schematic. In typical web coating systems, the web (the substrate in the present invention) would traverse many different rollers to change direction, provide tensioning, drive the web, and accumulate the web when downstream processing slows or stops.

Figure 2:
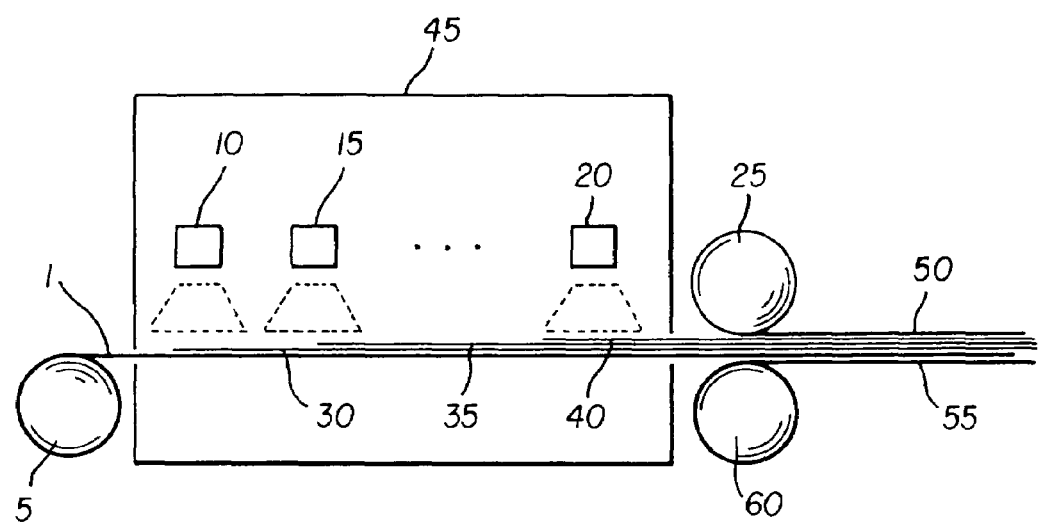
FIG. 2 is a schematic diagram of an embodiment of the present invention.

FIG. 2 is a schematic of an embodiment of the present invention. As in the prior art, a flexible substrate 1 is provided on a substrate supply roll 5 which typically contains a considerable length of the substrate. As the substrate unrolls and works its way through the coating machine 45, the substrate passes a series of coating sources 10, 15, and 20 which deposit material layers 30, 35, and 40. The coating sources can be evaporative sources in the case of small molecule OLEDs, or they can be inkjet heads, curtain coaters, or gravure printers for polymeric OLEDs, or they can employ any suitable coating technology depending on the type of OLED. Although not shown, the coating sources can contain the facility to produce a pattern of the deposited material. Patterning can be accomplished via masking, material removal, or by direct patterned deposition in which the deposition head is capable of directing material for deposition in selected locations.

After thin organic films forming the OLED have been deposited on the substrate, the substrate is sandwiched between a barrier cover 50 supplied from a barrier cover supply roll 25 and a barrier base 55. The barrier base 55 is supplied from a barrier base supply roll 60. The flexible substrate 1 is positioned above the barrier base 55 and below the barrier cover 50. Either one of the barrier base or barrier cover should be transparent in order to permit the light produced by the OLED to exit the device. Both the barrier cover 50 and the barrier base 55 should provide a barrier to water vapor and oxygen. By removing the requirement that the substrate should be a barrier for water or oxygen, the present invention provides added flexibility in choosing suitable materials for the substrate. By removing the requirement that an OLED be formed on the barrier cover 50 or the barrier base 55, the present invention provides added flexibility in choosing suitable materials for the barrier cover or the barrier base. For example, a nontransparent metal foil can readily be used as either the barrier cover 50 or the barrier base 55. Either the barrier base 55 or barrier cover 50, or both, can be made from polymeric materials. Still further, the present invention permits a wider selection of materials for use in forming the substrate.

Figure 3:
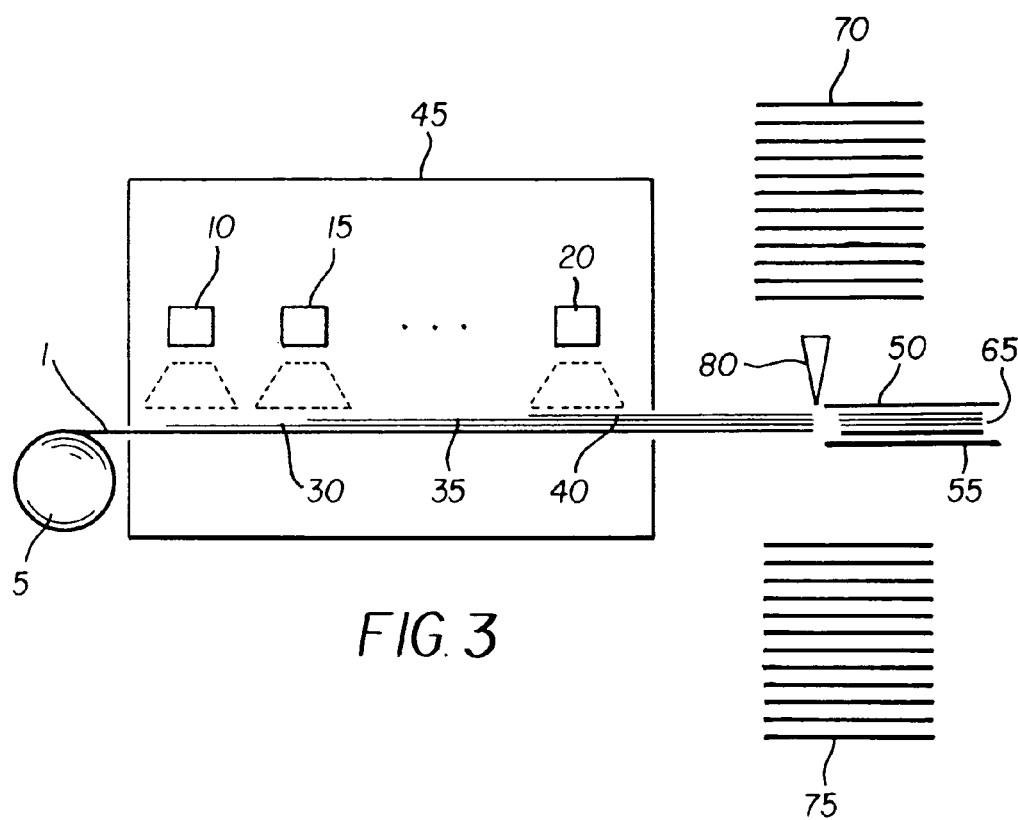
FIG. 3 is a schematic diagram of another embodiment of the invention using cut sheets of barrier cover and barrier base material.

FIG. 3 is a schematic of a second embodiment of the invention. In this embodiment, the barrier base 55 is supplied from a barrier base stack 75 of individual discrete sheets of barrier base material. Similarly, the barrier cover 50 is supplied from a barrier cover stack 70 of individual discrete sheets of barrier base material. A cut sheet 65 of OLED material is cut from the continuous substrate 1 with cutter 80 after all coating steps are complete. The cut sheet 65 is sandwiched between the barrier base and the barrier cover, which are sealed to one another. This embodiment of the invention facilitates the use of a wider range of barrier cover and barrier base materials because they are no longer required to be capable of being rolled. Low cost ordinary window glass can be used as the transparent choice between barrier base 55 and barrier cover 50. A simple metal foil can be adequate to serve as the other barrier layer in this case since the window glass can provide the rigidity needed for many applications of the OLEDs that will be produced using this method. These are only two of the many materials that are suitable when this process is employed. The ability to select from among a wide variety of substrates and barrier materials makes the invention particularly well suited to a wide variety of products. For example, OLED flat-panel light sources intended for general illumination will generally be very price-sensitive in nature and will therefore utilize the lowest-cost barrier materials. On the other hand, OLED flat-panel displays will require distortion free barriers on the viewing side, even at the expense of higher material costs.

Figure 4:
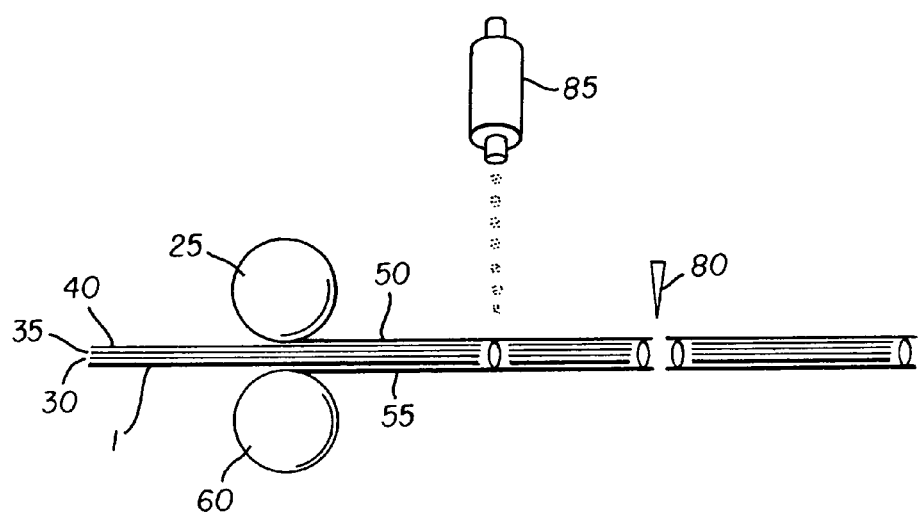
FIG. 4 is a detailed schematic diagram of sealing and cutting in the embodiment of FIG. 2.

FIG. 4 is a schematic of an embodiment of the invention for sealing in the structure produced by FIG. 2. The substrate 1 coated with material thin-films 30, 35 and 45 are produced as described in the explanation of FIG. 2. In this embodiment, coated substrate (the substrate with the thin-films) is fed between the barrier cover 50 and barrier base 55. A sealing unit 85, shown schematically in this diagram as a laser, seals the barrier cover to the barrier base through the coated substrate. The coated substrate is cut in the process of forming the seal. The package, now including the barrier cover, barrier base, and coated substrate, continues to advance until it reached the cutter 80 which cuts through the barrier cover and barrier base (and the coated substrate if not already cut by the sealing process).

Although not shown, it will be clear to one of ordinary skill in the art that the method of FIG. 3 in which the coated substrate is cut before being placed between the barrier cover 50 and the barrier base 55 can be applied in the system of FIG. 2 which uses rolls of barrier base 55 and barrier cover 50, rather than discrete pieces as in the embodiment of FIG. 3. Likewise, the embodiment of FIG. 4 in which a continuous coated substrate is fed between the barrier cover and barrier base and sealed while uncut can be applied to the embodiment of FIG. 3 in which the barrier cover 50 and barrier base 55 are supplied in discrete sheets.

Although the substrate supply 5 is shown as a continuous roll, it will be clear that a supply of discrete sheet material can also be used in a similar manner.

Figure 5A:
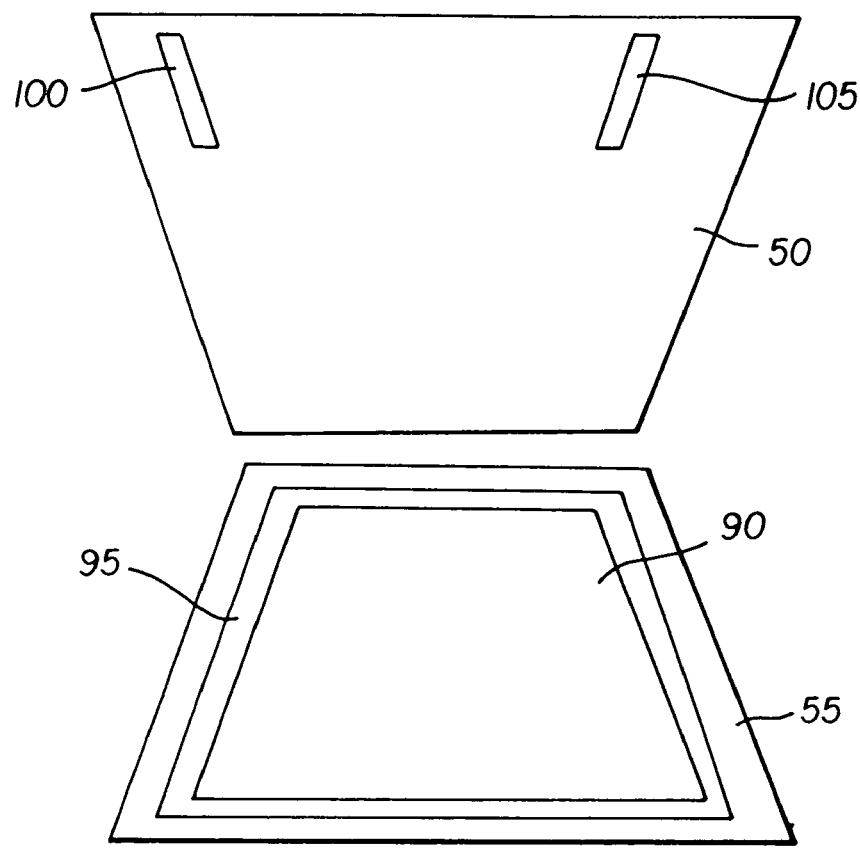
FIG. 5A is a schematic diagram illustrating one embodiment for making electrical contacts between OLED electrodes and external power sources.
Figure 5B:
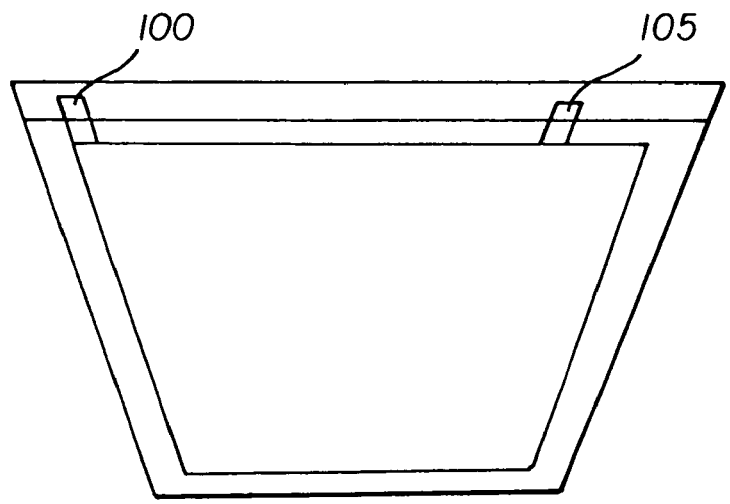
FIG. 5B is a second view of the devices shown in 5A.

Another embodiment of the present invention is shown in FIG. 5. FIG. 5A shows where an anode lead 100 and a cathode lead 105 are provided on one or both of the barrier cover 50 or barrier base 55. FIG. 5B shows how electrical contact is made between the anode lead 100 and the anode 95 of the organic light-emitting diode, and between the cathode lead 105 and the cathode 90 of the organic lighting diode on the substrate. When the seal is made directly between barrier cover 50 and barrier base 55, the organic light-emitting diode is encapsulated with the anode lead 100 and the cathode lead 105 extending beyond the seal such that electrical power can be applied to the light-emitting diode through these leads. No part of flexible substrate 1, however, is exposed to the atmosphere. The anode lead 100 and the cathode lead 105 are provided as metallic conductive films that can made by conventional film deposition techniques such as evaporation, sputtering, silk screening, electroless plating, or other deposition techniques.

The electrical leads, in the form of wires, tapes, or ribbons, can be attached to the anode and cathode of the OLED light-emitting diode and extended through and beyond the seal between the barrier cover 50 and barrier base 55 so that electrical power can be applied to the OLED light-emitting diode via these electrical leads causing it to emit light. When the substrate with the organic light-emitting diode is encapsulated, the seal is made directly between barrier cover 50 and barrier base 55 with no part of flexible substrate 1 exposed to the atmosphere.

The invention has been described in detail with particular reference to certain preferred embodiments thereof, but it will be understood that variations and modifications can be effected within the spirit and scope of the invention.

PARTS LIST

1 flexible substrate
5 substrate supply roll
10 coating source
15 coating source
20 coating source
25 barrier cover supply roll
30 material thin-film
35 material thin-film
40 material thin-film
45 coating machine
50 barrier cover
55 barrier base
60 barrier base supply roll
65 cut sheet
70 barrier cover supply stack
75 barrier base supply stack
80 cutter
85 sealing unit
90 cathode
95 anode
100 anode lead
105 cathode lead

The invention claimed is:

1. A method for making organic light-emitting diodes on a flexible substrate comprising:
    a) supplying a flexible substrate;
    b) forming a plurality of thin-film layers on the flexible substrate to produce an organic light-emitting diode;
    c) positioning the flexible substrate above a barrier base and disposing a barrier cover over the substrate and the barrier base;
    d) sealing the barrier base to the barrier cover to encapsulate the substrate between the barrier cover and the barrier base; and
    e) providing an anode lead and a cathode lead on one or both of the barrier cover or barrier base and causing electrical contact between the anode lead and the anode of the organic light-emitting diode and between cathode lead and the cathode of the organic light-emitting diode on the substrate.

2. The method according to claim 1 wherein the flexible substrate is supplied in a continuous roll.

3. The method according to claim 1 wherein the flexible substrate is supplied in discrete sheets.

4. The method according to claim 1 wherein the flexible substrate includes a polymer.

5. The method according to claim 1 wherein the flexible substrate is a glass.

6. The method according to claim 1 wherein the barrier base or the barrier cover, or both, is supplied in continuous rolls.

7. The method according to claim 1 wherein the barrier base or barrier cover, or both, is supplied in discrete sheets.

8. The method according to claim 1 wherein the barrier base or the barrier cover, or both, includes a polymer.

9. The method according to claim 1 where the barrier base or barrier cover, or both, includes glass.

10. The method according to claim 1 wherein the barrier base or barrier cover, or both, includes a metal.

11. The method according to claim 1 wherein the thin-film layers includes polymeric materials.

12. The method according to claim 1 wherein the thin-film layers includes small molecule materials.

13. The method according to claim 1 wherein the organic light-emitting diode forms a flat panel light source.

14. The method according to claim 1 wherein the organic light-emitting diode forms a flat panel display device.

15. The method according to claim 1 wherein the coated flexible substrate is cut from the continuous roll prior to being placed and sealed between the barrier base and the barrier cover.

16. The method according to claim 1 wherein uncut coated flexible substrate is sealed between the barrier cover and the barrier base.

17. The method according to claim 1 wherein the substrate and the organic light-emitting diode are encapsulated between the barrier cover and the barrier base with the anode lead and the cathode lead extending beyond the seal such that electrical power can be applied to the light-emitting diode through these leads, and wherein no part of flexible substrate is exposed to the atmosphere.

18. The method according to claim 1 wherein the anode lead and the cathode lead are metallic conductive films made by evaporation, sputtering, silk screening, or electroless plating.

19. A method for making organic light-emitting diodes on a flexible substrate comprising:
   a) supplying a flexible substrate;
   b) forming a plurality of thin-film layers on the flexible substrate to produce an organic light-emitting diode;
   c) positioning the flexible substrate above a barrier base and disposing a barrier cover over the substrate and the barrier base;
   d) sealing the barrier base to the barrier cover to encapsulate the substrate between the barrier cover and the barrier base; and
   e) providing electrical leads in the form of wires, tapes, or ribbons attached to the anode and cathode of the organic light-emitting diode and extended through and beyond the seal between the barrier cover and barrier base so that electrical power can be applied to the organic light-emitting diode via these electrical leads causing it to emit light.

20. The method according to claim 19 wherein no part of the flexible substrate is exposed to the atmosphere.

* * * * *